(12) United States Patent
Chuang et al.

(10) Patent No.: US 12,223,989 B2
(45) Date of Patent: Feb. 11, 2025

(54) SEMICONDUCTOR DEVICE AND METHOD FOR FABRICATING THE SAME

(71) Applicant: TAIWAN SEMICONDUCTOR MANUFACTURING CO., LTD., Hsinchu (TW)

(72) Inventors: Harry-Hak-Lay Chuang, Zhubei (TW); Sheng-Huang Huang, Hsinchu (TW); Hung-Cho Wang, Taipei (TW); Sheng-Chang Chen, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/151,994

(22) Filed: Jan. 9, 2023

(65) Prior Publication Data
US 2023/0140896 A1    May 11, 2023

Related U.S. Application Data

(63) Continuation of application No. 16/943,990, filed on Jul. 30, 2020, now Pat. No. 11,551,736.

(51) Int. Cl.
| | |
|---|---|
| *G11C 11/16* | (2006.01) |
| *G11C 5/02* | (2006.01) |
| *G11C 5/06* | (2006.01) |
| *H10B 61/00* | (2023.01) |
| *H10N 50/01* | (2023.01) |
| *H10N 50/80* | (2023.01) |

(52) U.S. Cl.
CPC ............ *G11C 11/161* (2013.01); *G11C 5/025* (2013.01); *G11C 5/06* (2013.01); *H10B 61/00* (2023.02); *H10N 50/01* (2023.02); *H10N 50/80* (2023.02)

(58) Field of Classification Search
CPC ......... G11C 11/161; G11C 5/025; G11C 5/06; H10B 61/00; H10N 50/01; H10N 50/80
USPC ....................................................... 257/421
See application file for complete search history.

(56) References Cited

U.S. PATENT DOCUMENTS

| | | |
|---|---|---|
| 2015/0115348 A1 | 4/2015 | Nam |
| 2016/0049298 A1 | 2/2016 | Okada |
| 2016/0133671 A1* | 5/2016 | Fantini ............. H01L 21/76837 257/4 |
| 2020/0052038 A1 | 2/2020 | Chen |
| 2020/0127053 A1 | 4/2020 | Kim |

* cited by examiner

*Primary Examiner* — Tu-Tu V Ho
(74) *Attorney, Agent, or Firm* — Maschoff Brennan

(57) ABSTRACT

A method for fabricating a semiconductor device is provided. The method includes forming a first memory cell and a second memory cell over a substrate, wherein each of the first and second memory cells comprises a bottom electrode, a resistance switching element over the bottom electrode, and a top electrode over the resistance switching element; depositing a first dielectric layer over the first and second memory cells, such that the first dielectric layer has a void between the first and second memory cells; depositing a second dielectric layer over the first dielectric layer; and forming a first conductive feature and a second conductive feature in the first and second dielectric layers and respectively connected with the top electrode of the first memory cell and the top electrode of the second memory cell.

20 Claims, 14 Drawing Sheets

SEMICONDUCTOR DEVICE AND METHOD FOR FABRICATING THE SAME

PRIORITY CLAIM AND CROSS-REFERENCE

This application is a continuation of U.S. patent application Ser. No. 16/943,990, filed Jul. 30, 2020, now U.S. Pat. No. 11,551,736, issued Jan. 10, 2023, the entirety of which is incorporated by reference herein in their entireties.

BACKGROUND

Semiconductor memories are used in integrated circuits for electronic applications, including radios, televisions, cell phones, and personal computing devices, as examples. One type of semiconductor memory device involves spin electronics, which combines semiconductor technology and magnetic materials and devices. The spins of electrons, through their magnetic moments, rather than the charge of the electrons, are used to indicate a bit.

One such spin electronic device is magnetoresistive random access memory (MRAM) array, which includes conductive lines (word lines and bit lines) positioned in different directions, e.g., perpendicular to each other in different metal layers. The conductive lines sandwich a magnetic tunnel junction (MTJ), which functions as a magnetic memory cell.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
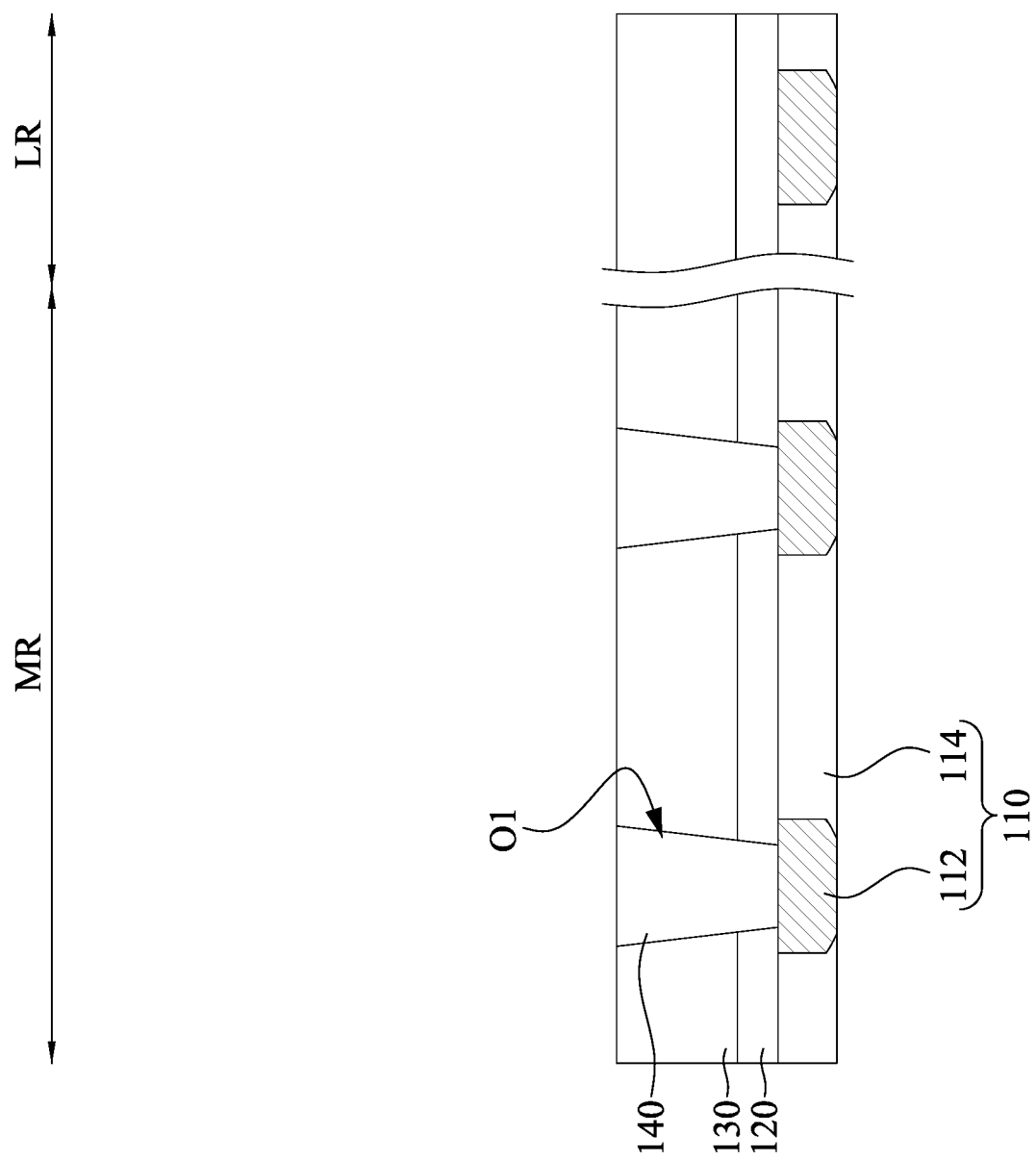
FIGS. 1-13 are cross-sectional views of a semiconductor device at various intermediate stages of manufacture according to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to some embodiments of this disclosure, a magnetoresistive random access memory (MRAM) device is formed. The MRAM device includes a magnetic tunnel junction (MTJ) stack. The resistance switching element includes a tunnel barrier layer formed between a ferromagnetic pinned layer and a ferromagnetic free layer. The tunnel barrier layer is thin enough (such as a few nanometers) to permit electrons to tunnel from one ferromagnetic layer to the other. A resistance of the resistance switching element is adjusted by changing a direction of a magnetic moment of the ferromagnetic free layer with respect to that of the ferromagnetic pinned layer. When the magnetic moment of the ferromagnetic free layer is parallel to that of the ferromagnetic pinned layer, the resistance of the resistance switching element is in a lower resistive state, corresponding to a digital signal "0". When the magnetic moment of the ferromagnetic free layer is anti-parallel to that of the ferromagnetic pinned layer, the resistance of the resistance switching element is in a higher resistive state, corresponding to a digital signal "1". The resistance switching element is coupled between top and bottom electrodes and an electric current flowing through the resistance switching element (tunneling through the tunnel barrier layer) from one electrode to the other is detected to determine the resistance and the digital signal state of the resistance switching element.

According to some embodiments of this disclosure, memory cells are formed within a chip region of a substrate. A plurality of semiconductor chip regions is marked on the substrate by scribe lines between the chip regions. The substrate will go through a variety of cleaning, layering, patterning, etching and doping steps to form the MRAM devices. The term "substrate" herein generally refers to a bulk substrate on which various layers and device elements are formed. In some embodiments, the bulk substrate includes silicon or a compound semiconductor, such as GaAs, InP, SiGe, or SiC. Examples of the layers include dielectric layers, doped layers, polysilicon layers or conductive layers. Examples of the device elements include transistors, resistors, and/or capacitors, which may be interconnected through an interconnect layer to additional integrated circuits.

FIG. 1 illustrates a wafer having a substrate 110 thereon. The substrate 110 has a logic region LR where logic circuits are to be formed and a memory region MR where memory cells are to be formed. The substrate 110 includes an interlayer dielectric (ILD) layer or inter-metal dielectric (IMD) layer 114 with a metallization pattern 112 over the logic region LR and the memory region MR. The ILD layer 114 may be silicon oxide, fluorinated silica glass (FSG), carbon doped silicon oxide, tetra-ethyl-ortho-silicate (TEOS) oxide, phosphosilicate glass (PSG), borophosphosilicate glass (BPSG), Black Diamond® (Applied Materials of Santa Clara, Calif.), amorphous fluorinated carbon, low-k dielectric material, the like or combinations thereof. The metallization pattern 112 may be aluminum, aluminum alloy, copper, copper alloy, titanium, titanium nitride, tantalum, tantalum nitride, tungsten, cobalt, the like, and/or combinations thereof. Formation of the metallization pattern 112 and the ILD layer 114 may be a dual-damascene process and/or a single-damascene process. The substrate 110 may also include active and passive devices, for example, underlying the ILD layer 114. These further components are omitted from the figures for clarity.

An etch stop layer 120 and a dielectric layer 130 are formed over the logic region LR and the memory region MR of the substrate 110 in a sequence. The etch stop layer 120 may have a high etch resistance to one or more subsequent etching processes. The etch stop layer 120 may be formed of dielectric material different from the underlying ILD layer 114. For example, the ILD layer 114 may be a silicon oxide layer, and the etch stop layer 120 may be a silicon nitride layer.

The dielectric layer 130 in some embodiments is silicon carbide (SiC), silicon oxynitride (SiON), silicon nitride (SiN), silicon dioxide, TEOS, low-k dielectrics, black diamond, FSG, PSG, BPSG, the like, and/or combinations thereof. The dielectric layer 130 may be a single-layered structure or a multi-layered structure. The dielectric layer 130 may be formed by acceptable deposition techniques, such as chemical vapor deposition (CVD), atomic layer deposition (ALD), physical vapor deposition (PVD), the like, and/or a combination thereof.

Openings O1 are formed in the etch stop layer 120 and the dielectric layer 130 in the memory region MR1, and exposes portions of the metallization pattern 112. An exemplary formation method of the openings O1 includes forming a patterned mask over the dielectric layer 130, and then etching the dielectric layer 130 and the etch stop layer 120 through the patterned mask by one or more etching processes, such as dry etching, wet etching, or combinations thereof. After the formation of the openings O1, the patterned mask is removed from the dielectric layer 130 by suitable ashing process.

Bottom electrode vias (BEVA) 140 are then formed within the openings O1. In some embodiments, at least one of the BEVAs 140 is a multi-layered structure and includes, for example, a diffusion barrier layer and a filling metal filling a recess in the diffusion barrier layer. An exemplary formation method of the BEVAs 140 includes forming in sequence the diffusion barrier layer and the filling metal into the openings O1, and performing a planarization process, such as a chemical-mechanical polish (CMP) process, to remove excess materials of the filling metal and of the diffusion barrier layer outside the openings O1. The remaining diffusion barrier layer and the remaining filling metal in the openings O1 can serve as the BEVAs 140. In some embodiments, the BEVAs 140 are electrically connected to an underlying electrical component, such as a transistor, through the metallization pattern 112.

In some embodiments, the diffusion barrier layer is a titanium nitride (TiN) layer or a tantalum nitride (TaN) layer, which can act as a suitable barrier to prevent metal diffusion. Formation of the diffusion barrier layer may be exemplarily performed using CVD, PVD, ALD, the like, and/or a combination thereof. In some embodiments, the filling metal is titanium (Ti), tantalum (Ta), platinum (Pt), ruthenium (Ru), tungsten (W), aluminum (Al), copper (Cu), the like, and/or combinations thereof. Formation of the filling metal may be exemplarily performed using CVD, PVD, ALD, the like, and/or a combination thereof.

Figure 2:
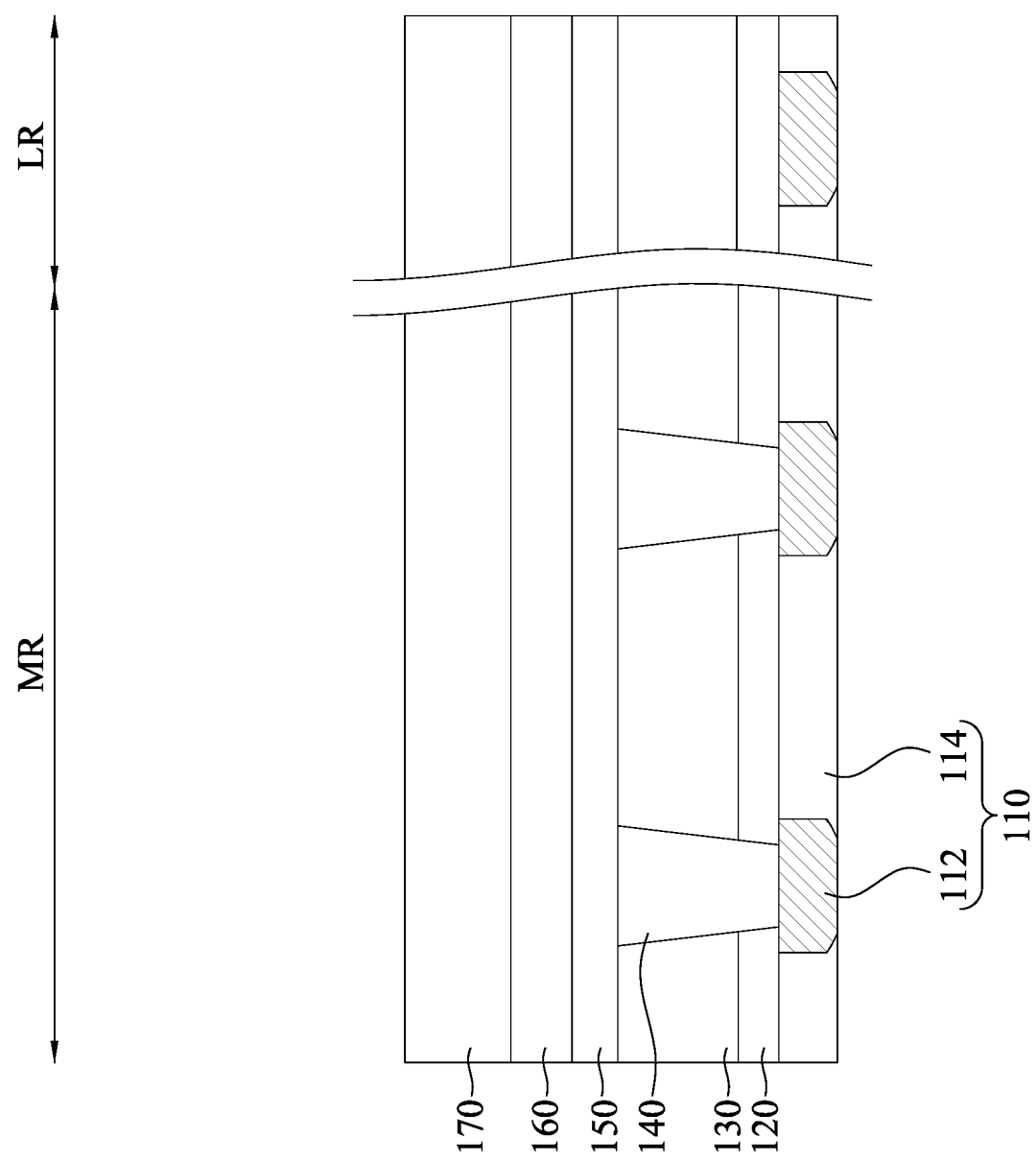

Reference is made to FIG. 2. A bottom electrode layer 150 is then blanketly formed over the BEVAs 140 and over the dielectric layer 130, so that the bottom electrode layer 150 extends along top surfaces of the BEVAs 140 and of the dielectric layer 130. The bottom electrode layer 150 can be a single-layered structure or a multi-layered structure. In some embodiments, the bottom electrode layer 150 is titanium (Ti), tantalum (Ta), platinum (Pt), ruthenium (Ru), tungsten (W), aluminum (Al), copper (Cu), TiN, TaN, the like, and/or a combination thereof. Formation of the bottom electrode layer 150 may be exemplarily performed using CVD, PVD, ALD, the like, and/or a combination thereof.

A resistance switching layer 160 is formed over the bottom electrode layer 150. In some embodiments, the resistance switching layer 160 may be a magnetic tunnel junction (MTJ) structure. To be specific, the resistance switching layer 160 includes at least a first magnetic layer, a tunnel barrier layer and a second magnetic layer formed in sequence over the bottom electrode layer 150. The magnetic moment of the second magnetic layer may be programmed causing the resistance of the resulting MTJ cell to be changed between a high resistance and a low resistance.

In some embodiments, the first magnetic layer includes an anti-ferromagnetic material (AFM) layer over the bottom electrode layer 150 and a ferromagnetic pinned layer over the AFM layer. In the anti-ferromagnetic material (AFM) layer, magnetic moments of atoms (or molecules) align in a regular pattern with magnetic moments of neighboring atoms (or molecules) in opposite directions. A net magnetic moment of the AFM layer is zero. In certain embodiments, the AFM layer includes platinum manganese (PtMn). In some embodiments, the AFM layer includes iridium manganese (IrMn), rhodium manganese (RhMn), iron manganese (FeMn), or OsMn. An exemplary formation method of the AFM layer includes sputtering, PVD, ALD or the like.

The ferromagnetic pinned layer in the first magnetic layer forms a permanent magnet and exhibits strong interactions with magnets. A direction of a magnetic moment of the ferromagnetic pinned layer can be pinned by an anti-ferromagnetic material (AFM) layer and is not changed during operation of a resulting resistance switching element fabricated from the resistance switching layer 160. In certain embodiments, the ferromagnetic pinned layer includes cobalt-iron-boron (CoFeB). In some embodiments, the ferromagnetic pinned layer includes CoFeTa, NiFe, Co, CoFe, CoPt, or the alloy of Ni, Co and Fe. An exemplary formation method of the ferromagnetic pinned layer includes sputtering, PVD, ALD, thermal or e-beam evaporated deposition. In some embodiments, the ferromagnetic pinned layer includes a multilayer structure.

The tunnel barrier layer is formed over the first magnetic layer. The tunnel barrier layer can also be referred to as a tunneling layer, which is thin enough that electrons are able to tunnel through the tunnel barrier layer when a biasing voltage is applied to a resulting resistance switching element fabricated from the resistance switching layer 160. In certain embodiments, the tunnel barrier layer includes magnesium oxide (MgO), aluminum oxide ($Al_2O_3$), aluminum nitride (AlN), aluminum oxynitride (AlON), hafnium oxide ($HfO_2$) or zirconium oxide ($ZrO_2$). An exemplary formation method of the tunnel barrier layer includes sputtering, PVD, ALD, e-beam or thermal evaporated deposition, or the like.

The second magnetic layer is formed over the tunnel barrier layer. The second magnetic layer is a ferromagnetic free layer in some embodiments. A direction of a magnetic moment of the second magnetic layer is not pinned because there is no anti-ferromagnetic material in the second magnetic layer. Therefore, the magnetic orientation of this layer is adjustable, thus the layer is referred to as a free layer. In some embodiments, the direction of the magnetic moment of the second magnetic layer is free to rotate parallel or anti-parallel to the pinned direction of the magnetic moment of the ferromagnetic pinned layer in the first magnetic layer. The second magnetic layer may include a ferromagnetic material similar to the material in the ferromagnetic pinned layer in the first magnetic layer. Since the second magnetic layer has no anti-ferromagnetic material while the first magnetic layer has an anti-ferromagnetic material therein, the first and second magnetic layers and have different materials. In certain embodiments, the second magnetic layer includes cobalt, nickel, iron or boron, compound or alloy thereof. An exemplary formation method of the second magnetic layer includes sputtering, PVD, ALD, e-beam or thermal evaporated deposition, or the like.

A top electrode layer 170 is formed over the resistance switching layer 160. The top electrode layer 170 includes a conductive material. In some embodiments, the top electrode layer 170 is similar to the bottom electrode layer 150 in terms of composition. In some embodiments, the top electrode layer 170 comprises titanium (Ti), tantalum (Ta), platinum (Pt), ruthenium (Ru), tungsten (W), aluminum (Al), copper (Cu), the like or combinations thereof. An exemplary formation method of the top electrode layer 170 includes sputtering, PVD, ALD or the like.

Figure 3:
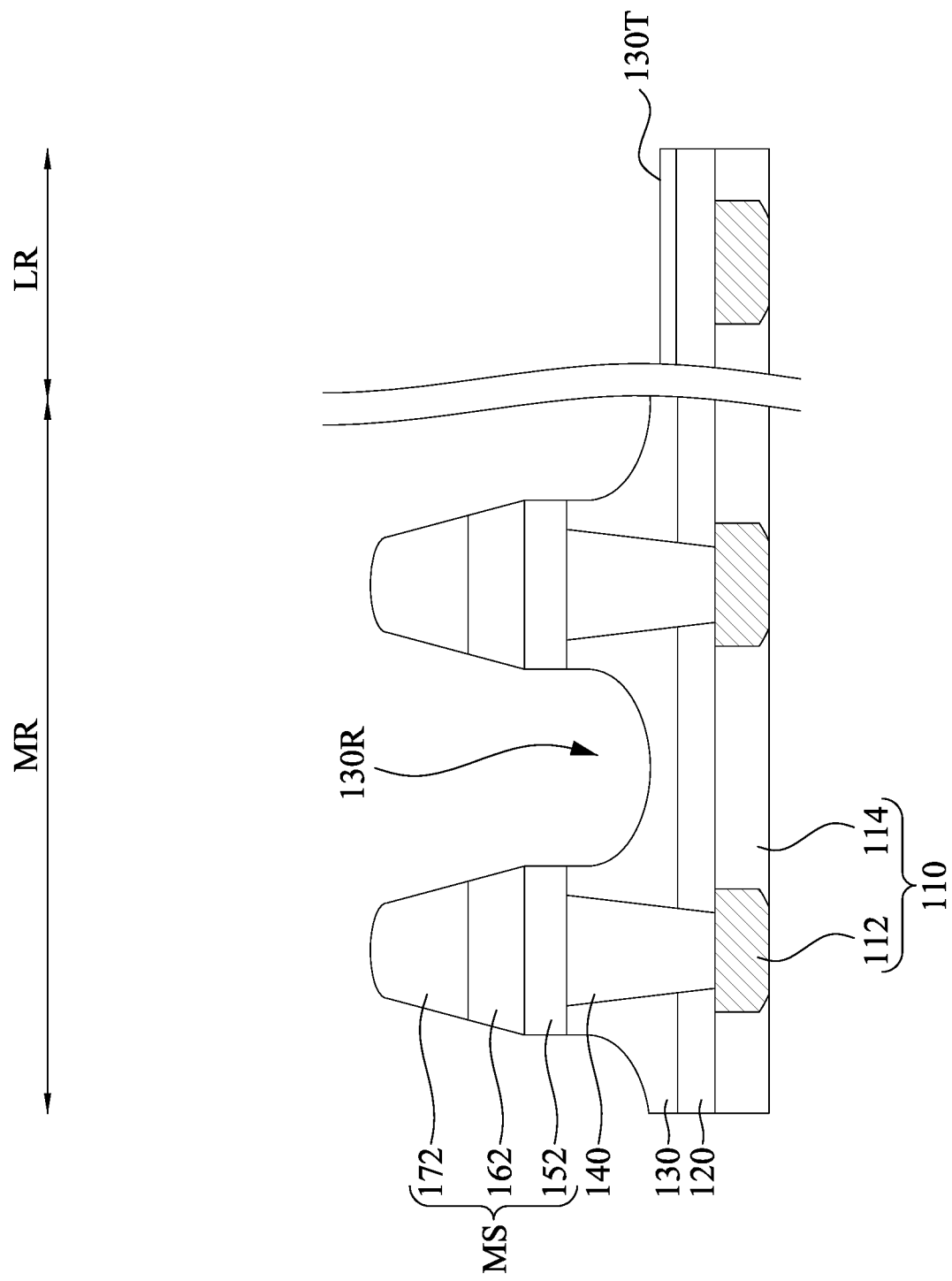

Reference is made to FIG. 3. The top electrode layer 170, the resistance switching layer 160, and the bottom electrode layer 150 (referring to FIG. 2) are patterned into top electrodes 172, resistance switching elements 162, and bottom electrodes 152 in the memory region MR. The top electrodes 172, the resistance switching elements 162, and the bottom electrodes 152 in combination may be referred to as memory stacks MS. In the present embodiments, the patterning may include a directional physical dry etching process, such as IBE process. The IBE process may use an etchant gas such as an Ar series Kr, Ne, Ar, O, N, the like, or a combination thereof. The IBE process may be performed in a chamber with a rotatable stage or substrate table with more than one axis of rotation. This rotation allows a more uniform etch profile and allows control of the angle of incidence of the ion beam. The IBE process may have an end point detection system to allow the etching process to stop before etching through the underlying dielectric layer 130.

In some embodiments, the physical dry etching process may etch the underlying dielectric layer 130, thereby forming recesses 130R in the dielectric layer 130. In some embodiments, the recesses 130R in the dielectric layer 130 are designed to be deep enough to reduce the amount of redeposition films on sidewalls of MTJ structure during the IBE process. For example, in some embodiments, a thickness of the dielectric layer 130 is in a range from about 40 nanometers to about 70 nanometers, and a depth of the recess 130R may be in a range from about 20 nanometers to about 50 nanometers. If the thickness of the dielectric layer 130 is less than 40 nanometers, the IBE process performed to form the resistance switching elements 162 without the redeposition films may etch through the dielectric layer 130, such that the recess 130R may expose underlying etch stop layer 120. If the thickness of the dielectric layer 130 is greater than 70 nanometers, due to the limited thickness of the ILD layer subsequently formed (e.g., the ILD layer 210 in FIG. 10), a portion of the ILD layer subsequently formed above the top electrode 172 may be too thin, which may result in difficulty in the formation of the top electrode via (referring to FIG. 13). The BEVA 140 may have a height in a range from about 40 nanometers to about 70 nanometers according to the thickness of the dielectric layer 130. Through the IBE process, the memory stacks MS are formed with high aspect ratio, which in turn may induce gap fill issue in subsequent process. The IBE process may also lower a top surface 130T of the dielectric layer 130 in the region LR.

Figure 4:
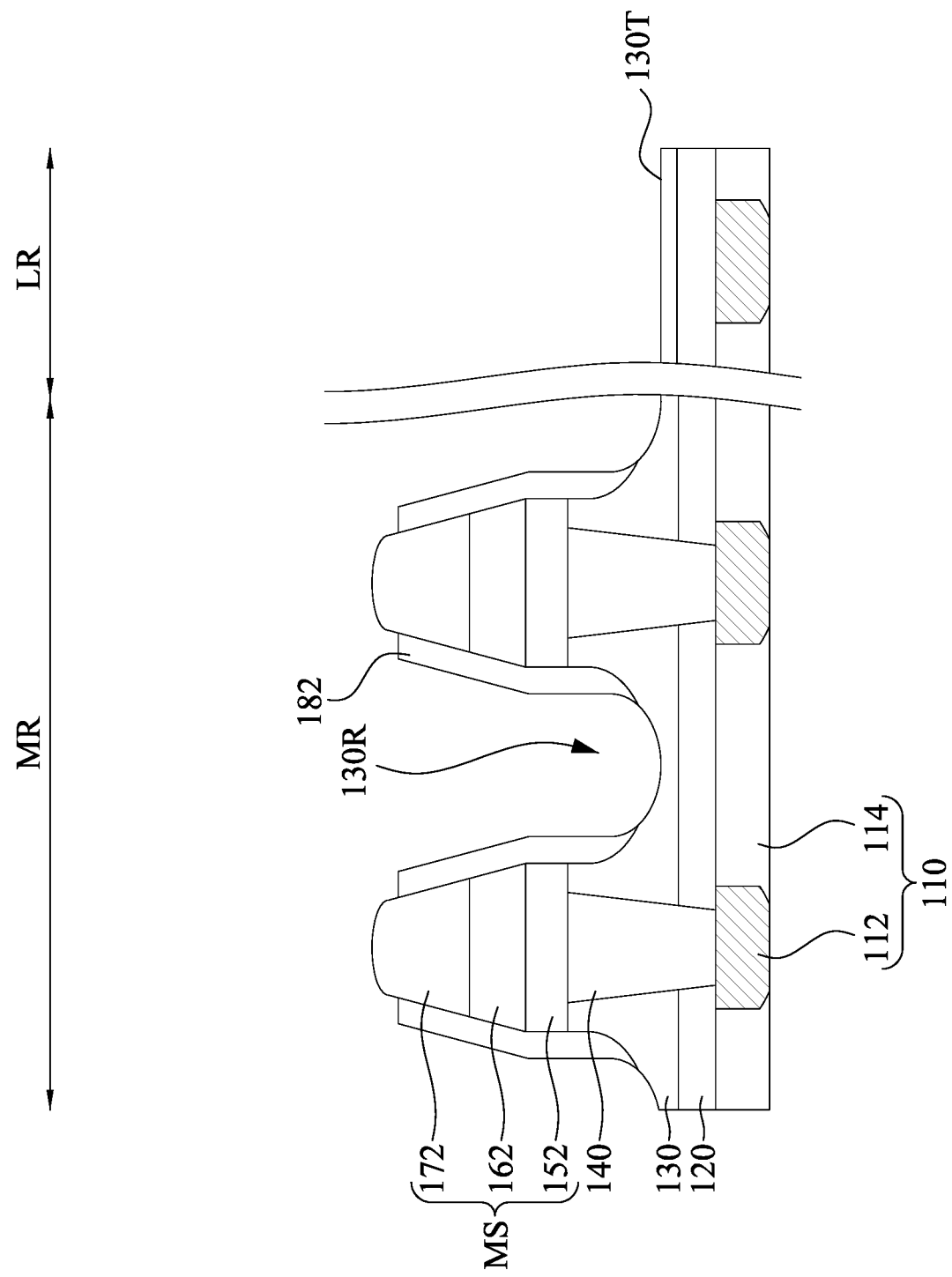

Reference is then made to FIG. 4. Spacers 182 are respectively formed around and enclosing the memory stacks MS. The spacer 182 in some embodiments may include SiN, but in other embodiments may include SiC, SiON, silicon oxycarbide (SiOC), the like, and/or combinations thereof. The formation of the spacers 182 may include depositing a spacer layer over the memory stacks MS and the dielectric layer 130, and then patterning the spacer layer into the spacers 182 by suitable etching process. Deposition of the spacer layer may include CVD, PVD, ALD, the like, and/or combinations thereof. The etching process may be anisotropic dry etching process (e.g., plasma etching process), using gas etchants such as $CH_2F_2$, $CF_4$, $CH_xF_y$, $CHF_3$, $CH_4$, $N_2$, $O_2$, Ar, He, or the like. The etching process removes horizontal portions of the spacer layer, and leaving vertical portions of the spacer layer on sidewalls of the memory stacks MS and the dielectric layer 130. The remaining vertical portions of the spacer layer may be referred to as the spacer 182 hereinafter. The spacer 182 may include multiple layers in some embodiments. In some embodiments, the dielectric layer 130 and the top electrodes 172 may have a higher etch resistance to the etching process than that of the spacer 182, such that the etching process to the spacer layer may stop at the top surfaces of the dielectric layer 130 and the top electrodes 172. After the etching process, portions of the top electrodes 172 are exposed by the spacers 182. In some embodiments, the etching process may further lower the top surface 130T of the dielectric layer 130 and deepen the recess 130R.

Figure 5:
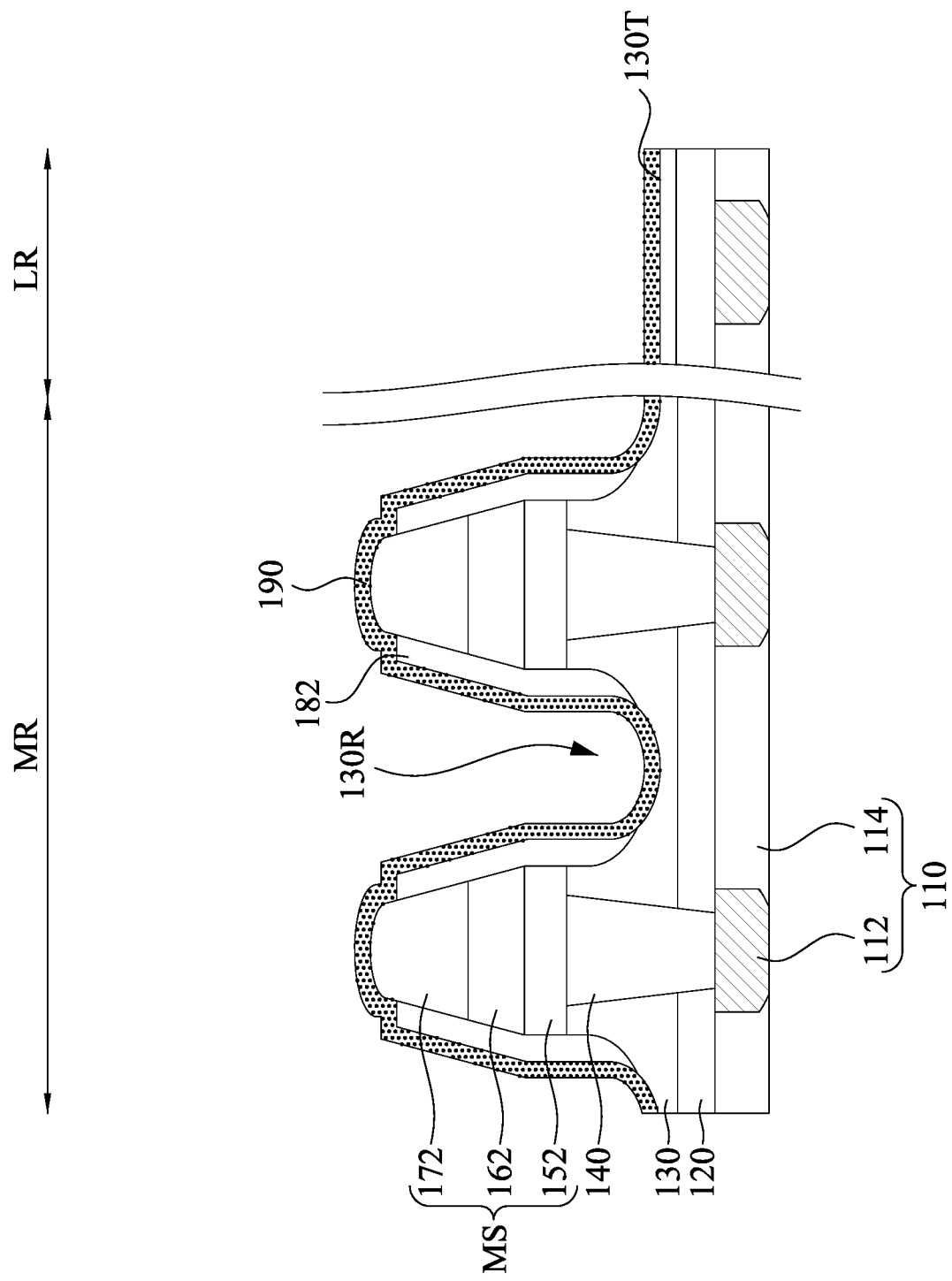

Reference is then made to FIG. 5. A protective layer 190 is conformally deposited over the spacer 182, the memory stacks MS, the dielectric layer 130. The protective layer 190 may be formed of dielectric material different from the etch stop layer 120, the dielectric layer 130, and the spacers 182. In some embodiments, the protective layer 190 may be a metal-containing compound layer. For example, the protective layer 190 is made from $AlO_x$, AlN, $AlN_yO_x$, other suitable material, or the combination thereof. In some other embodiments, the protective layer 190 may be a metal oxide layer containing other metals. In some other embodiments, the protective layer 190 may be dielectric layer, such as silicon nitride layer. In some embodiments, the protective layer 190 can be a single layer or a multi-layered structure.

Figure 6:
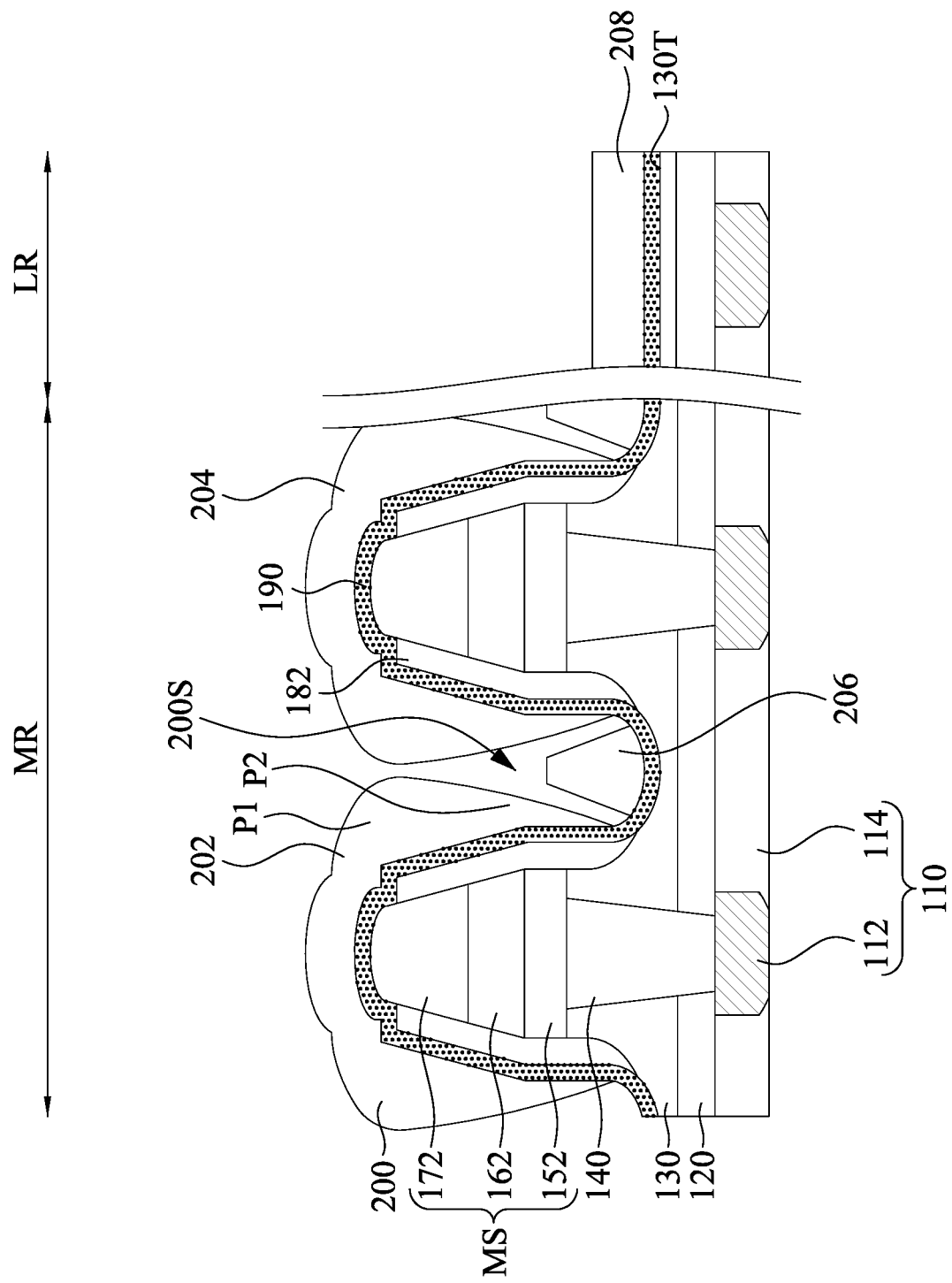
Figure 7:
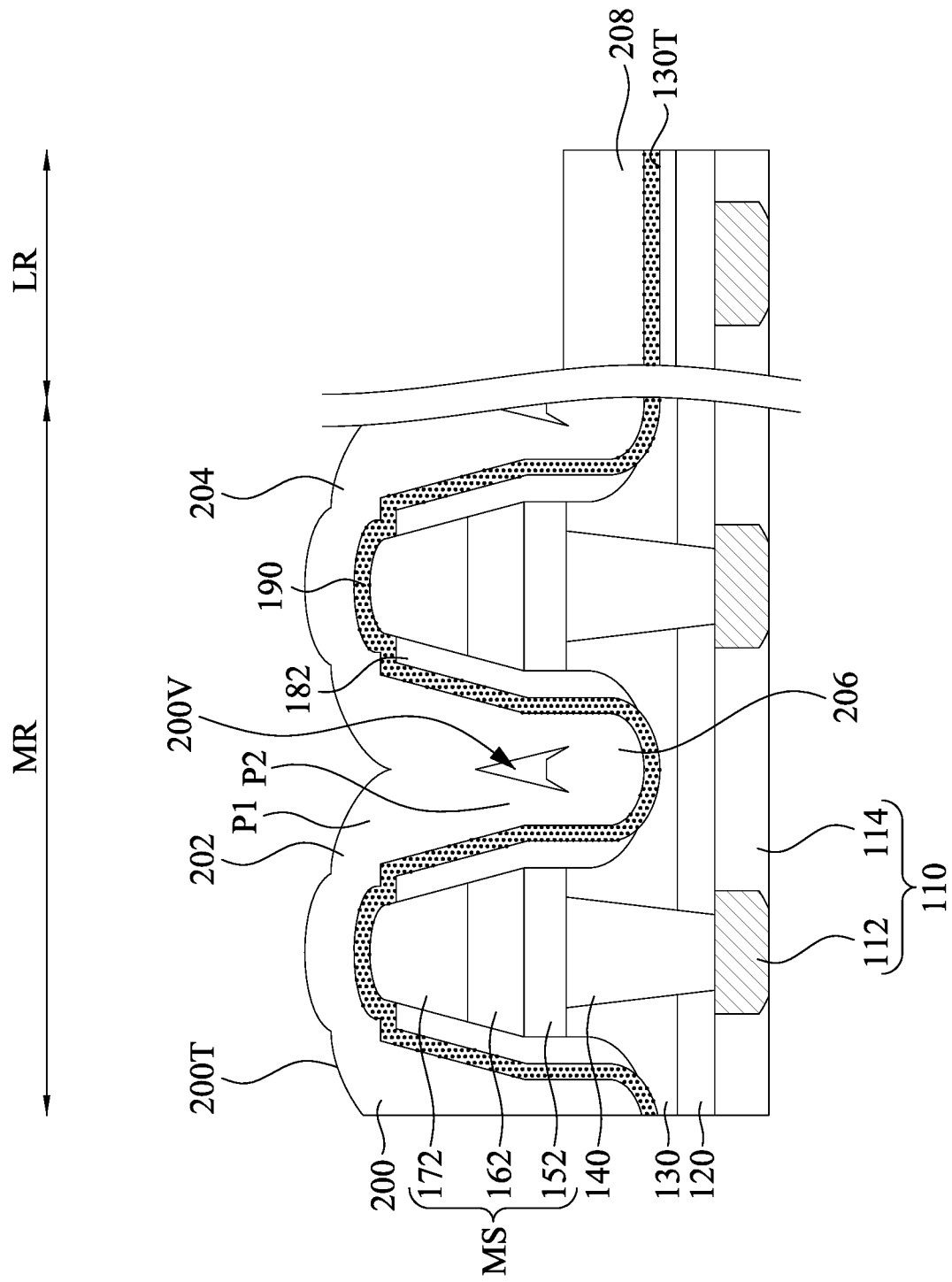

Reference is made to FIGS. 6 and 7. A dielectric material 200 is deposited over the structure of FIG. 5. In the present embodiments, the dielectric material 200 is deposited with poor step coverage compared with the deposition process of an ILD layer subsequently formed above the top electrode 172 (e.g., the ILD layer 210 in FIG. 10). For example, the deposition process of the dielectric material 200 may include PVD or CVD process, such as atmosphere pressure CVD (APCVD). In some embodiments where the dielectric material 200 is deposited by the CVD process, a deposition rate of the dielectric material 200 is greater than a deposition rate of the ILD layer subsequently formed above the top electrode 172 (e.g., the ILD layer 210 in FIG. 10). The dielectric material 200 may include suitable dielectric materials, such as oxides. In some embodiments, the dielectric material 200 may include a material different from that of the ILD layer subsequently formed above the top electrode 172 (e.g., the ILD layer 210 in FIG. 10). For example, the dielectric material 200 may include $SiO_x$, $SiN_x$, $SiO_xN_y$, or the like. Alternatively, in some other embodiments, the dielectric material 200 may include a same material with that of the ILD layer 210 in FIG. 10.

In the present embodiments, due to the fast depositing process, the dielectric material 200 is initially formed around the memory stacks MS, and then merged to have void 200V between the memory stacks MS. For example, in FIG. 6, at an initial stage, the depositing process may form a dielectric portion 202 around one of the memory stacks MS, a dielectric portion 204 around another of the memory stacks MS, and there is a space between the dielectric portions 202 and 204. Due to the fast depositing process, the dielectric portions 202 and 204 may have a first sub-portion P1 and a second sub-portion P2 below the first sub-portion at sidewalls of the memory stacks MS, and the first sub-portion P1 is thicker than the second sub-portion P2. The depositing process may also form a dielectric portion 206 over the protective layer 190 between the memory stacks MS and a dielectric portion 208 in logic region LR. Due to the poor coverage of the fast deposition process, a thickness of a portion of the dielectric material 200 between the dielectric portions 202 and 206 may be negligible, and a thickness of a portion of the dielectric material 200 between the dielectric portions 204 and 206 may be negligible. In other words, the dielectric portions 202-206 may be spaced apart from each other at the initial stage of the deposition process.

By continuing the depositing process, the dielectric portions 202-208 get thicker, and then merge with each other, as shown in FIG. 7. For example, in FIG. 7, the first sub-portion P1 of the dielectric portion 202 is merged and connected with the first sub-portions P1 of the dielectric portion 204. The second sub-portions P2 of the dielectric portions 202 and 204 may merge with the dielectric portion 206. In some embodiments, the merging result in voids 200V among the dielectric portions 202-206 in the memory region MR and next to the memory stacks MS. For example, the second sub-portions P2 of the dielectric portions 202 and 204 are not connected with each other, and have the void 200V therebetween. In other words, the dielectric portions 202-206 surrounds the void 200V. In some embodiments of the present disclosure, by suitable controlling the fast deposition process, a top end of the void 200V is formed at a position lower than a top surface of the top electrodes 172, thereby avoiding being exposed in subsequent processes. In some embodiments a top end of the void 200V is lower than a bottom surface of the top electrodes 172. In some embodiments a bottom end of the void 200V is higher than a bottom surface of the bottom electrodes 152.

In some embodiments, through the merging, the dielectric material 200 has a continues top surface 200T over the memory stacks MS in the memory region MR, in which the top surface 200T has a higher planarity than that of the protective layer 190. For example, a bottommost portion of the top surface 200T between the memory stacks MS in the memory region MR may be at a position higher than that of a top surface of the top electrodes 172. Through the configuration, the deposition of the dielectric material 200 may relax the high aspect ratio of the memory stack MS.

Figure 8:
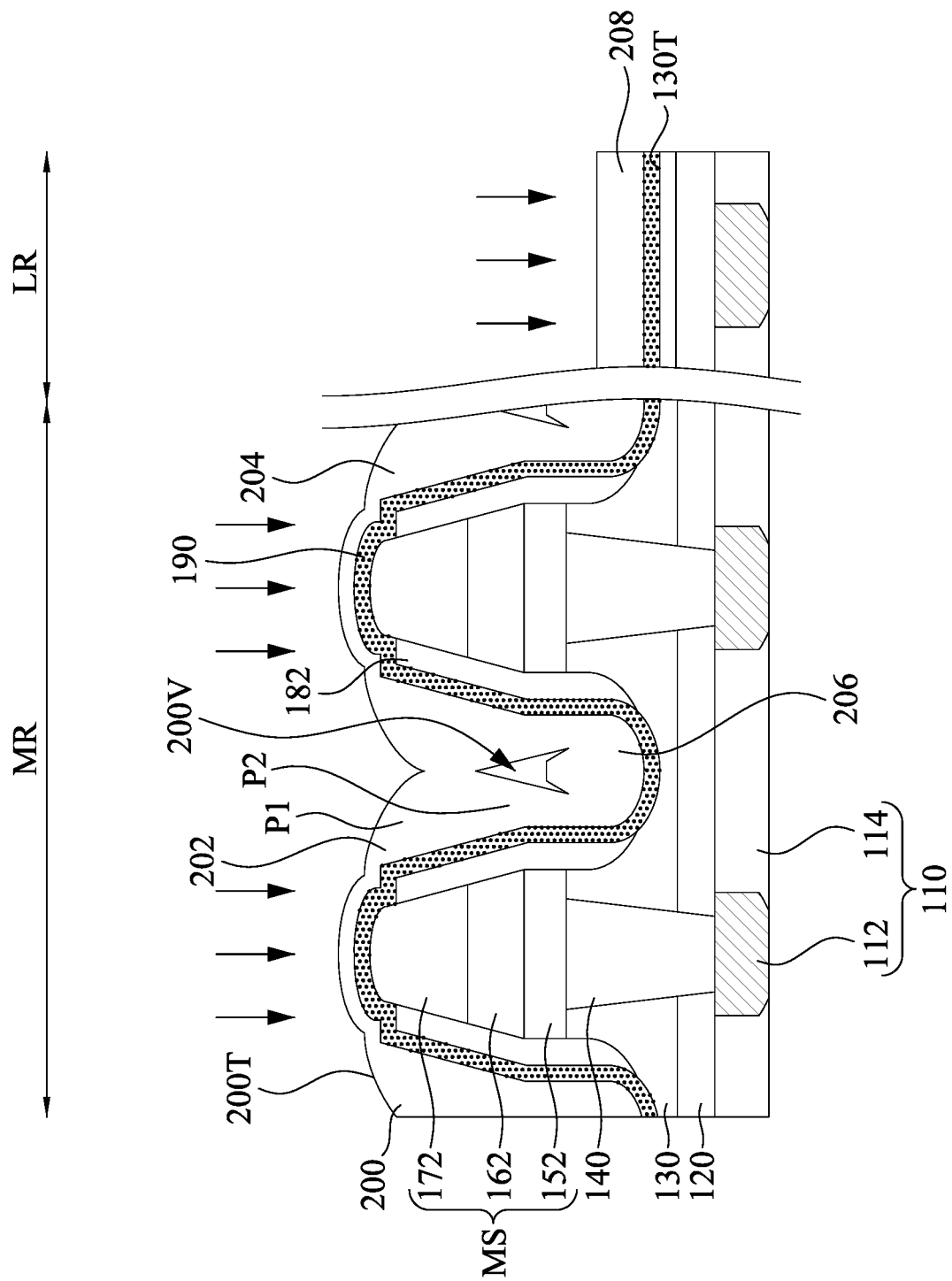

Reference is made to FIG. 8. The dielectric material 200 is etched back, thereby lowering a top surface 200T of the dielectric material 200 above the top electrode 172. The etch back process may use gas etchant, such as $CH_2F_2$, $CF_4$, $CH_xF_y$, $CHF_3$, $CH_4$, $N_2$, $O_2$, Ar, He, or the like. The etch back process may make the bottommost portion of the top surface 200T of the dielectric material 200 between the memory stacks MS in the memory region MR be at a position lower than that of the top surface of the top electrodes 172. After the etch back process, a top end of the void 200V remains at a position lower than the top surface 200T of the dielectric material 200. The etch back process may also lower the top surface 200T of the dielectric material 200 in the logic region LR. For example, after the etch back process, the top surface 200T of the dielectric material 200 in the logic region LR is lower than a bottom surface of the bottom electrode 152. Through the etch back process, a portion of the dielectric material 200 above the top electrode 172 is thinned, such that a portion of the ILD layer subsequently formed above the top electrode 172 may have suitable thickness, thereby benefiting the formation of the top electrode via (referring to FIG. 13).

Figure 9:
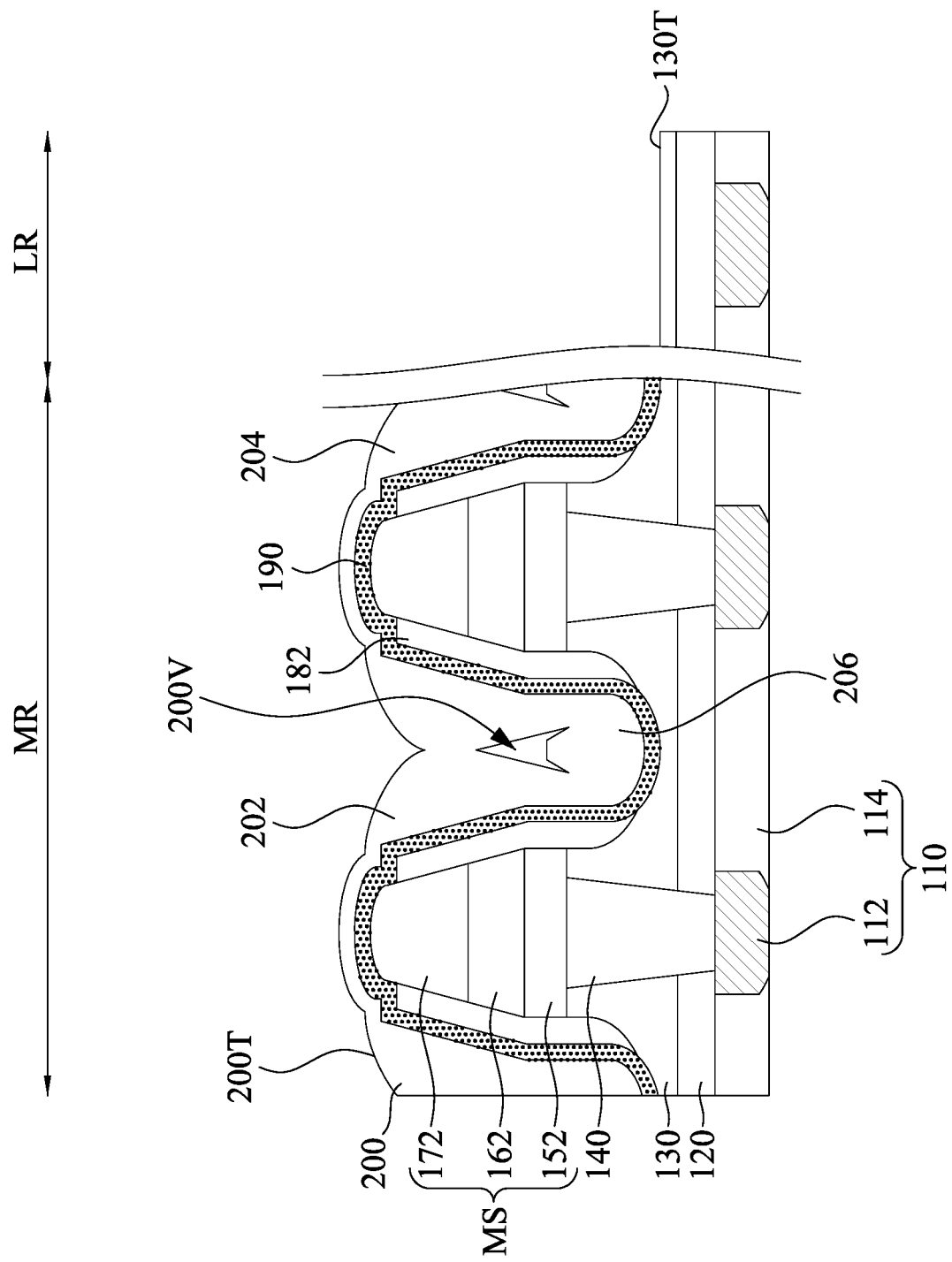

Reference is made to FIG. 9. The portion 208 of the dielectric material 200 and a portion of the protective layer 190 out of the memory region MR (referring to FIG. 8) may be removed by suitable etching process. The removal may include one or more etching processes. For example, a etch mask may be formed over the memory region MR and exposing the logic region LR, and a first etching process is performed to etch the portion 208 of the dielectric material 200 (referring to FIG. 8) over the logic region LR through the etch mask. The first etching process may use an etchant gas such as $CH_2F_2$, $CF_4$, $CH_xF_y$, $CHF_3$, $CH_4$, $N_2$, $O_2$, Ar, He, a combination thereof, or the like. The protective layer 190 may have a higher etch resistance to the first etching process than that of the dielectric material 200, thereby protecting underlying layers from being etched. Subsequently, a second etching process is performed to remove the portion of the protective layer 190 in the logic region LR (referring to FIG. 8) through the etch mask after the first etching process. The second etching process may use an etchant gas such as $Cl_2$, $BCl_3$, or the like, or a combination thereof. The dielectric layer 130 may have a higher etch resistance to the second etching process than that of the protective layer 190, thereby protecting underlying layers from being etched. The second etching process may further remove a portion of the dielectric layer 130 in the logic region LR, thereby lowering the top surface 130T of the dielectric layer 130 in the logic region LR. In some other embodiments, the second etching process may remove a portion of the dielectric layer 130 in the logic region LR, such that a top surface of the etch stop layer 120 in the logic region LR is exposed after the etching process.

Figure 10:
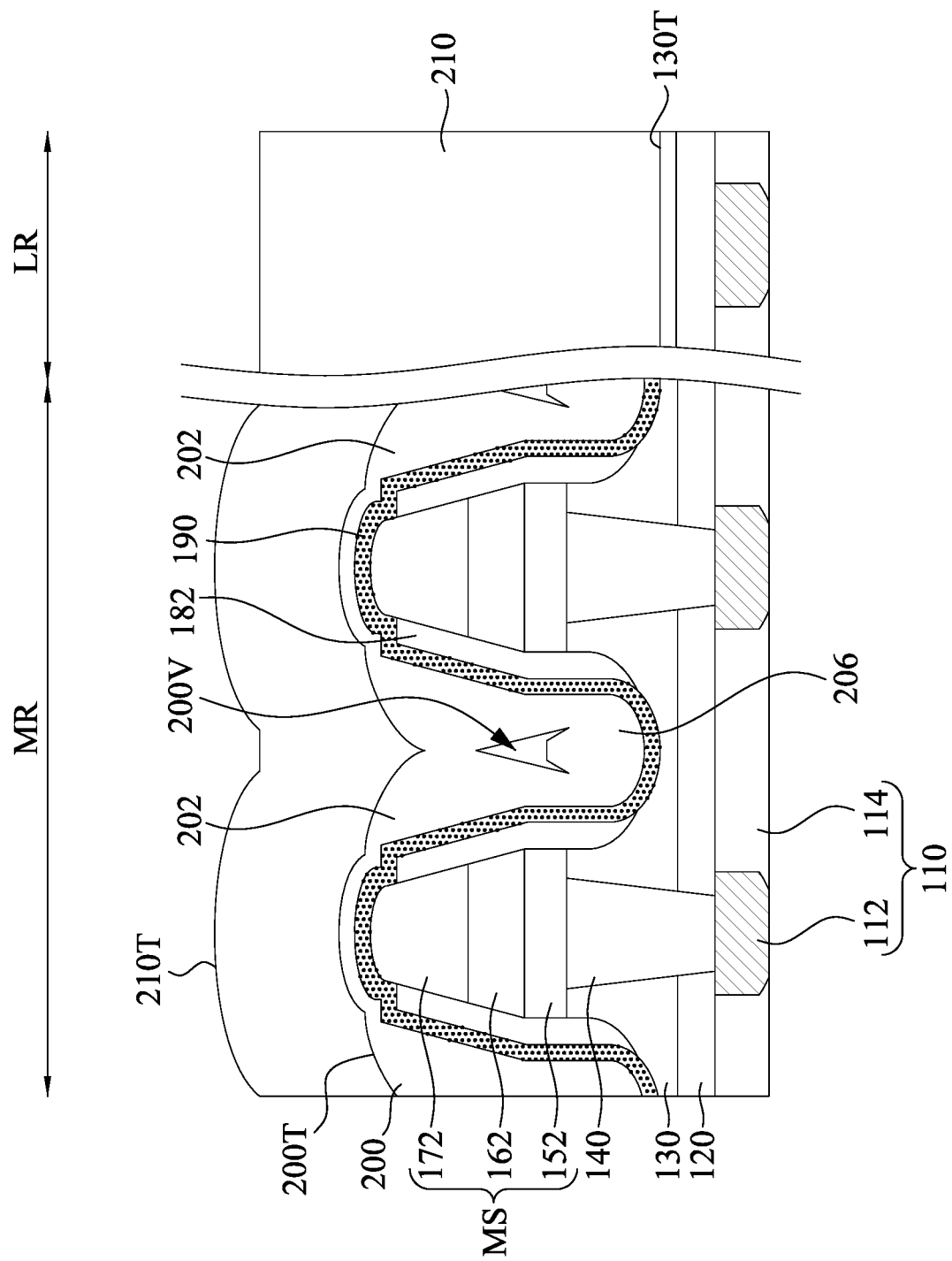

Reference is made to FIG. 10. An ILD layer 210 is formed with good step coverage over the structure of FIG. 9. In some embodiments, the ILD layer 210 includes silicon oxide, fluorinated silica glass (FSG), carbon doped silicon oxide, tetra-ethyl-ortho-silicate (TEOS) oxide, phosphosilicate glass (PSG), borophosphosilicate glass (BPSG), Black Diamond® (Applied Materials of Santa Clara, Calif.), amorphous fluorinated carbon, low-k dielectric material, the like or combinations thereof. As aforementioned, the ILD layer 210 may include a material the same as or different from that of the dielectric material 200. In some embodiments, the ILD layer 210 may have an interface with the dielectric material 200. In some embodiments, the ILD layer 210 may have a material the same as or different from that of the ILD layer 114. In some embodiments, the ILD layer 210 may be formed using suitable CVD process, such as low-pressure CVD (LPCVD), plasma-enhanced CDV (PECVD), or high density plasma CVD (HDPCVD). The CVD process of the ILD layer 210 may have a lower deposition rate than that of the CVD process of the dielectric material 200. In some other embodiments, the ILD layer 210 may be formed using, for example, spin-on-glass (SOG) or other suitable techniques. Through the process, the ILD layer 210 may have a top surface 210T conformal to the top surface 200T of the dielectric material 200. In some embodiments, the ILD layer 210 may not be deposited into the voids 200V in the dielectric material 200, such that the voids 200V remain being air voids.

Figure 11:
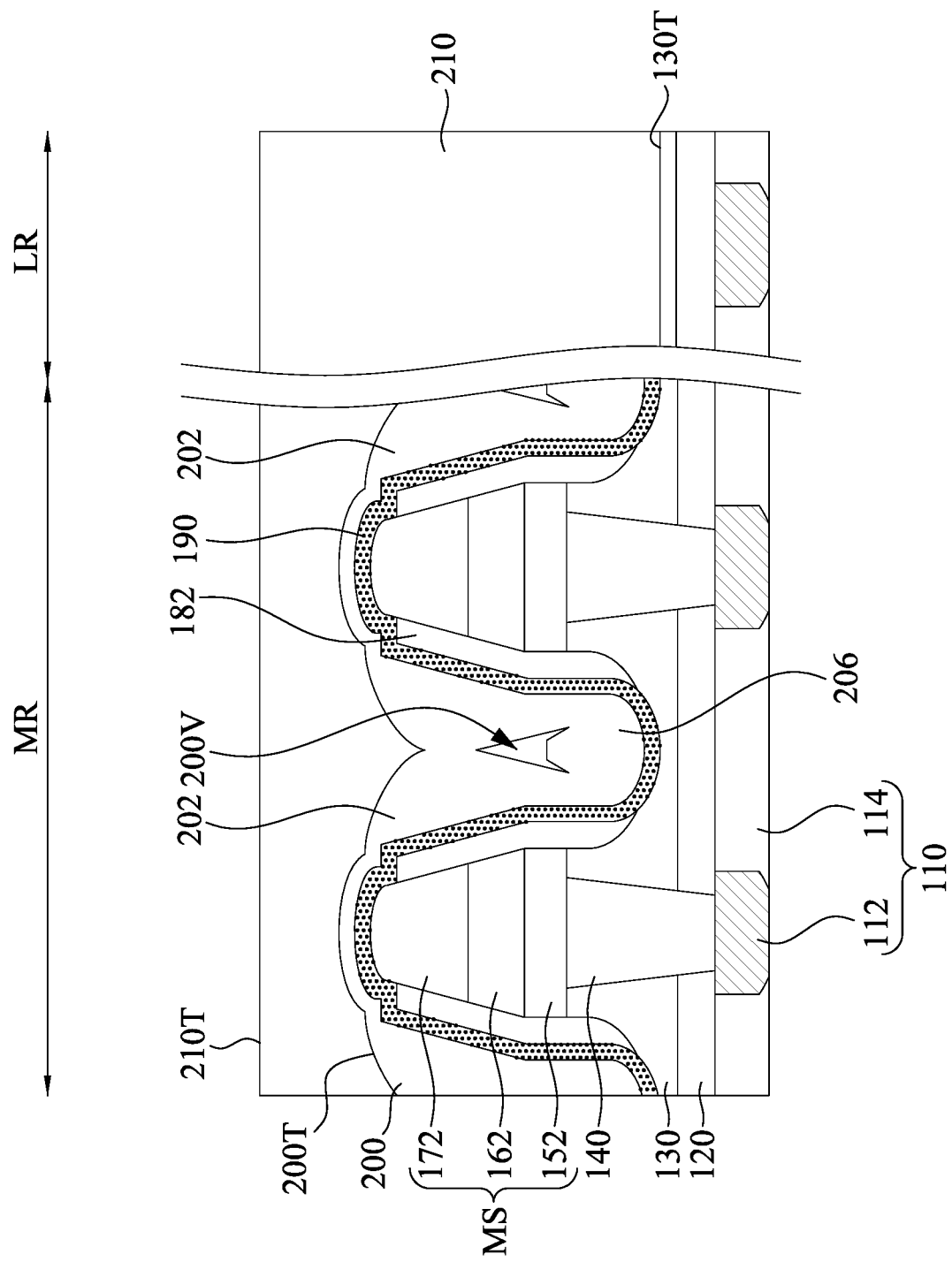

Reference is made to FIG. 11. After the formation of the ILD layer 210, a planarization process may be performed to the top surface 210T of the ILD layer 210, such that the top surface 210T of the ILD layer 210 becomes substantially flat. The planarization process may include a CMP process.

In absence of the dielectric material 200, the ILD layer 210 deposited with fine coverage may have voids between adjacent memory stacks MS having high aspect ratio. The voids of the ILD layer 210 may have their top ends higher than a top surface of the top electrodes 172. The planarization process performed to the ILD layer 210 may remove a portion of the ILD layer 210 and expose the voids. The exposed voids may be expanded in subsequent via and trench etching process, and induce undesired metal residues during subsequent formation process of metallization pattern, which may result in undesired contact short.

In some embodiments of the present disclosure, through the configuration of the dielectric material 200 with poor coverage, the voids 200V between the memory stacks MS are formed to have their top ends lower than that of the top electrodes 172 of the memory stacks MS. Through the configuration, the voids 200V would not be exposed during planarizing the ILD layer 210, which in turn will eliminate or reduce metal residues formed during the formation of the metallization pattern.

Figure 12:
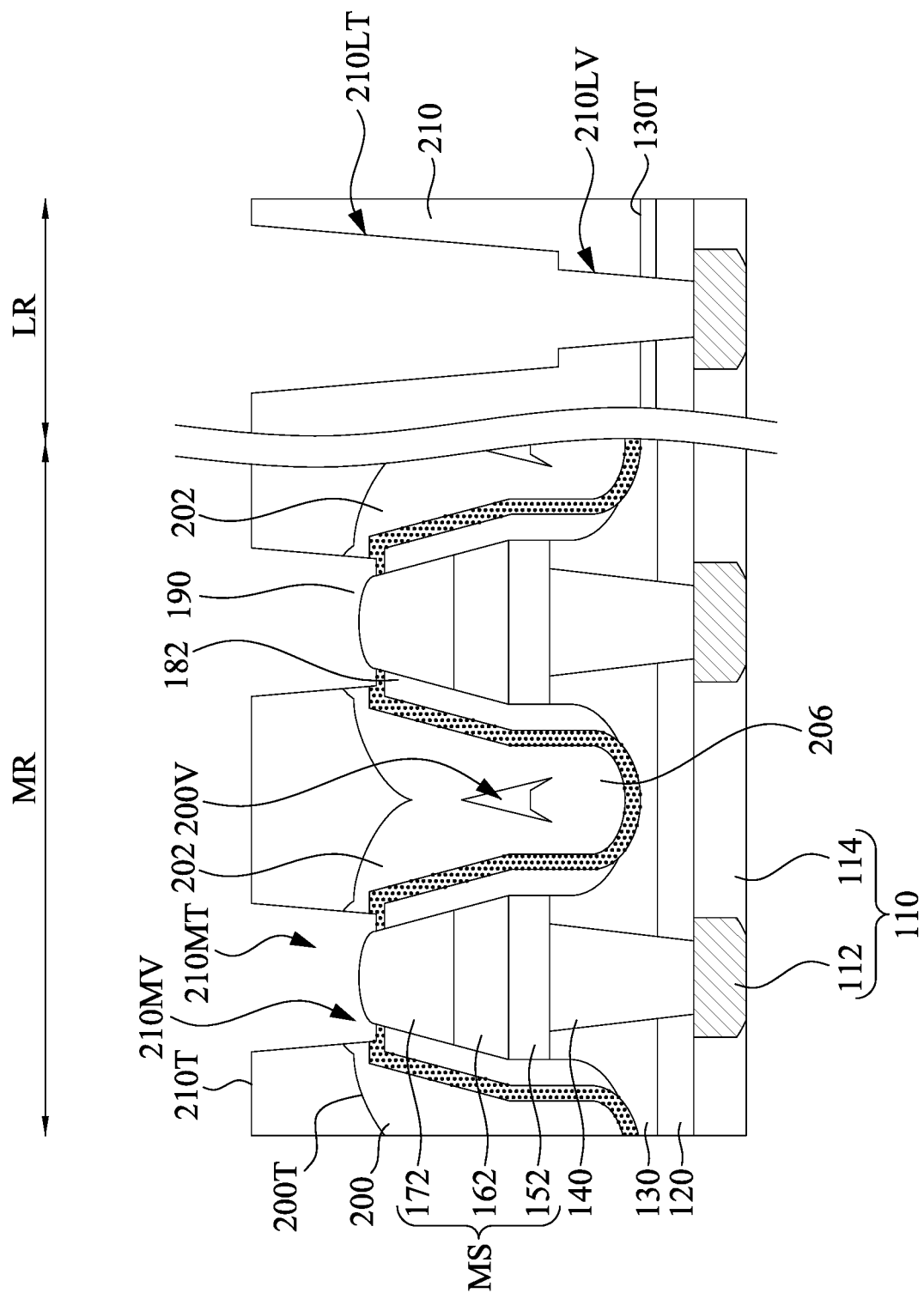

Reference is made to FIG. 12. Via openings 210MV and 210LV and trenches 210MT and 210LT are formed in the ILD layer 210. Formation of the via openings 210MV and 210LV and trenches 210MT and 210LT may include a via etching process, a trench etching process, a liner removal process. The via etching process may be performed to etch vias openings 210MV in the ILD layer 210 in the memory region MR and etch via openings 210LV in the ILD layer 210 and dielectric layer 130 in the logic region LR. The trench etching process may be performed to etch trenches 210MT in the ILD layer 210 in the memory region MR, etch trenches 210LT in the ILD layer 210 in the logic region LR, and deepen the vias openings 210MV and 210LV after the via etching process. The via etching process and the trench etching process may include suitable anisotropic etching processes. In some embodiments where the ILD layer 210 is silicon oxide, the etchant used in the via etching process and the trench etching process can be dilute hydrofluoric acid (HF), HF vapor, $CF_4$, $C_4F_8$, $CH_xF_y$, $C_xF_y$, $SF_6$, or $NF_3$, Ar, $N_2$, $O_2$, Ne, gas. In some embodiments, the liner removal process may be performed to slope the sidewalls of the via openings 210MV and 210LV and remove a portion of the etch stop layer 120 exposed by the via opening 210LV. The liner removal process may include one or more isotropic etching processes, such as dry etching processes using $CH_2F_2$ and Ar as etching gases.

In some embodiments, in the region MR, the protective layer 190 may have a higher etch resistance to the via and trench etching processes than that of the ILD layer 210, such that the via and trench etching processes may stop at the protective layer 190. After the via and trench etching processes, a cleaning process may be performed to remove residue polymers. The cleaning process may use suitable wet liquid, such as acid liquid. The cleaning process may consume and remove a portion of the protective layer 190 exposed by the via openings 210MV or the trench 210MT, thereby exposing the top electrodes 172. In some embodiments, the top electrodes 172 may have a higher resistance to the cleaning process than that of the protective layer 190, such that the cleaning process may stop at the top electrodes 172 and not damage the underlying layers.

In some embodiments, in the logic region LR, the etch stop layer 120 may have a higher etch resistance to the via and trench etching processes than that of the ILD layer 210 and the dielectric layer 130, such that the via and trench etching processes may stop at the etch stop layer 120. The liner removal process may remove a portion of the etch stop layer 120 exposed by the via opening 210LV and expose the underlying metallization pattern 112. In some embodiments, the metallization pattern 112 may have a higher etch resistance to the liner removal process than that of the etch stop layer 120, such that the liner removal process may stop at the metallization pattern 112 and not damage the underlying layers.

In some other embodiments, the vias openings 210MV may be omitted, and the via etching process may etch via openings 210LV and not etch vias openings 210MV in the ILD layer 210, and the trench etching process may be performed to etch the trenches 210MT until reaching the protective layer 190. Through the cleaning process, portions of the protective layers 190 exposed by the trenches 210MT may be removed, and the trenches 210MT may expose the top electrodes 172.

Figure 13:
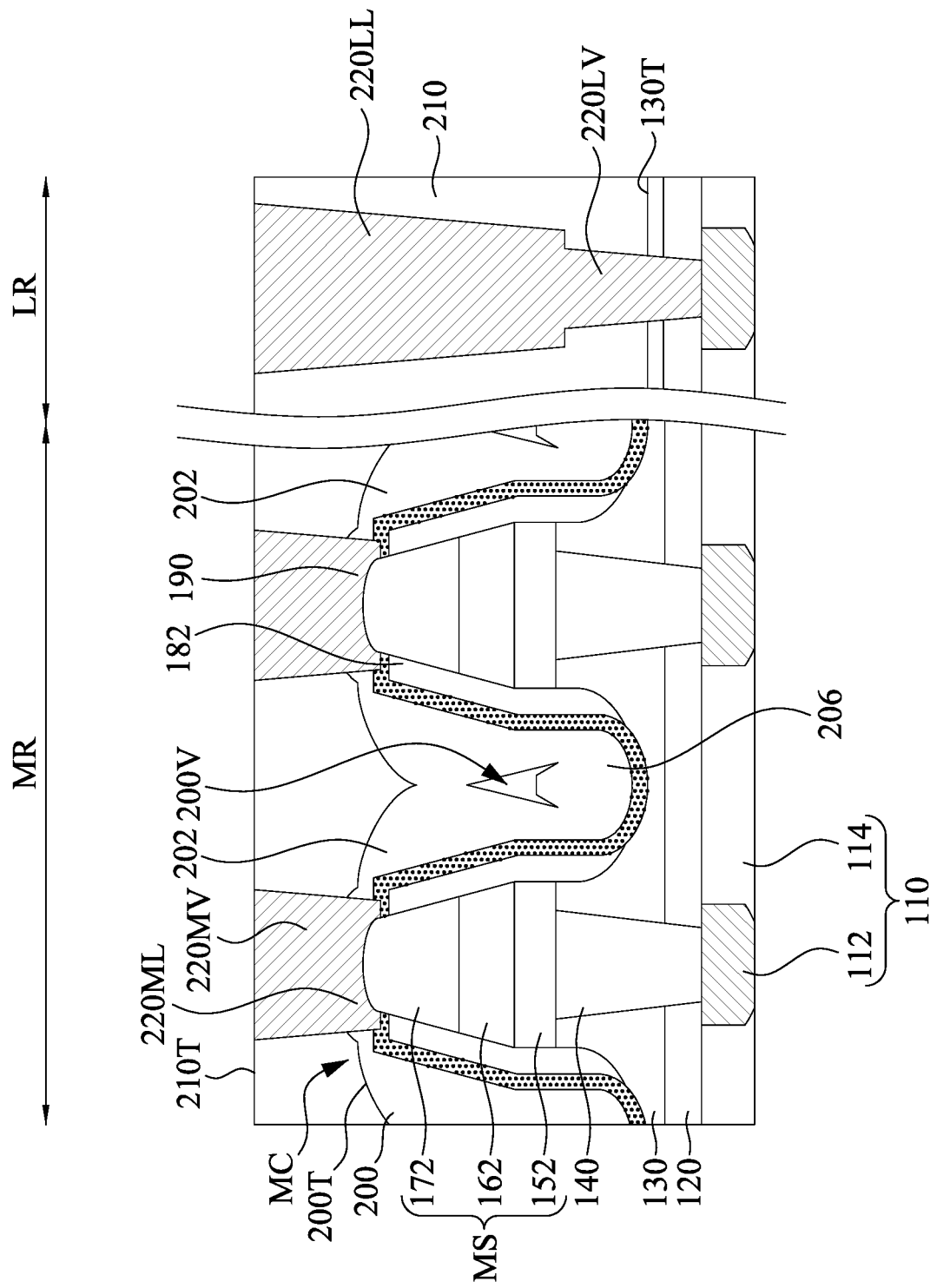

Reference is made to FIG. 13. The via openings 210MV and 210LV and trenches 210MT and 210LT are filled with one or more conductive materials. The conductive materials may include metals, such as titanium (Ti), tantalum (Ta), platinum (Pt), ruthenium (Ru), tungsten (W), aluminum (Al), copper (Cu), the like, and/or combinations thereof. Formation of the conductive materials may be exemplarily performed using CVD, PVD, ALD, the like, and/or a combination thereof. After the via openings 210MV and 210LV and trenches 210MT and 210LT are filled with the conductive materials, a planarization is performed to remove an excess portion of the conductive materials outside the openings, thereby forming a metallization pattern in the ILD layer 210. For example, in the memory region MR, the metallization pattern may include top electrode vias 220MV formed in the via openings 210MV and metal lines 220ML in the trenches 210MT. In some embodiments, a top electrode via 220MV and a metal line 220ML may be referred to as a memory conductive feature in some embodiments. In some embodiments, the top electrode via 220MV may be omitted, and the top electrode 172 may be directly connected with the metal lines 220ML. In the logic region LR, the metallization pattern may include the conductive via 220LV in the via openings 210LV and the metal lines 220LL in the trenches 210LT. In some embodiments, a conductive via 220LV and a metal lines 220LL may be referred to as a logic conductive feature in some embodiments.

Through the configuration, plural memory cells MC are formed. In some embodiments, each of the memory cells MC includes a resistance switching element 162, a top electrode 172 over the resistance switching element 162, and a bottom electrode 152 under the resistance switching element 162. In the present embodiments, a BEVA 140 is formed under the bottom electrode 152, and a top electrode via 220MV is formed over the top electrode 172.

Figure 14:
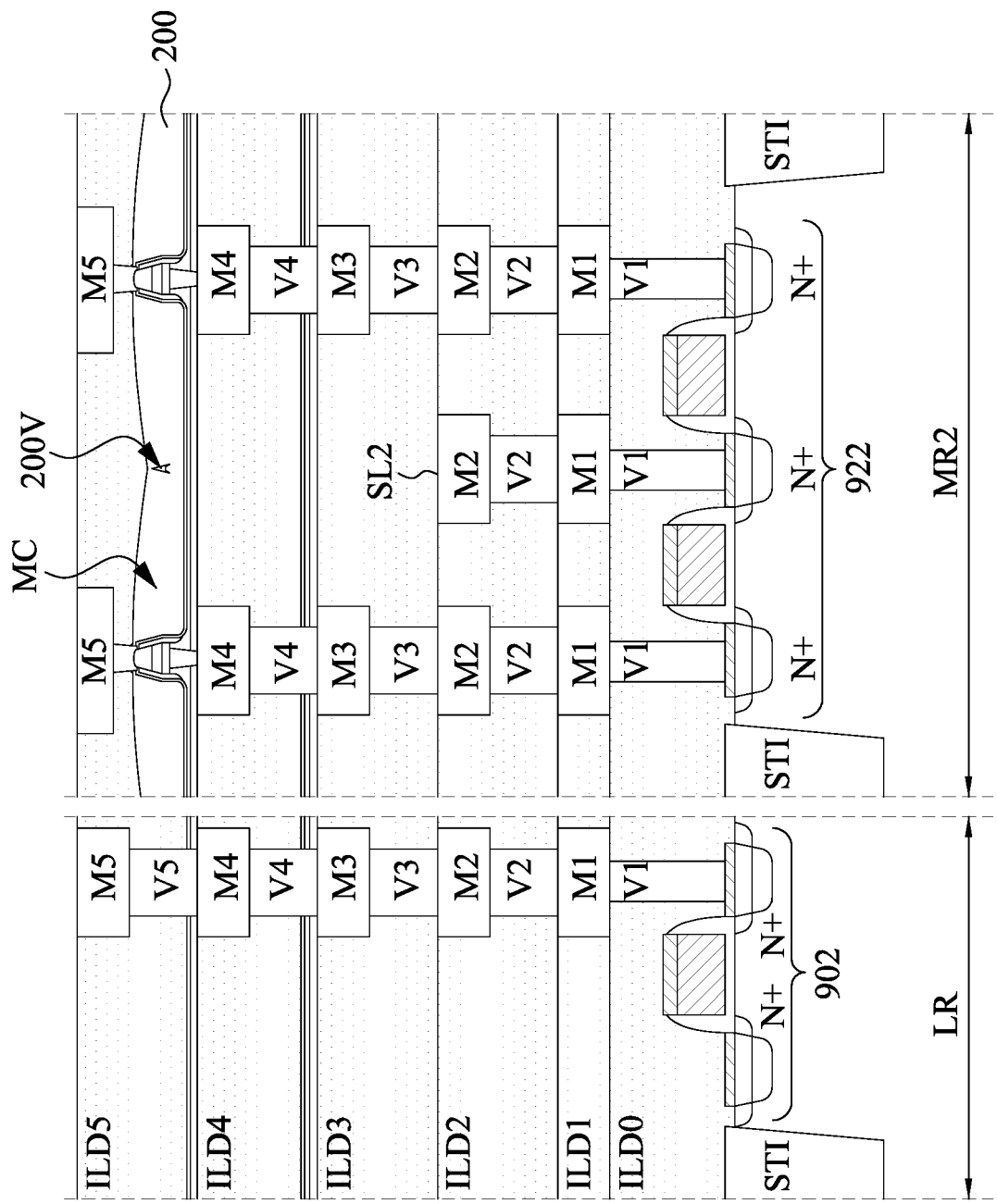
FIG. 14 illustrates an integrated circuit including MRAM devices and logic devices.

FIG. 14 illustrates an integrated circuit including memory cells and logic devices. The integrated circuit includes a logic region LR and a memory region MR. Logic region LR may include circuitry, such as the exemplary transistor 902, for processing information received from memory cells MC in the memory regions MR and for controlling reading and writing functions of memory cells MC.

As depicted, the integrated circuit is fabricated using five metallization layers, labeled as M1 through M5, with five layers of metallization vias or interconnects, labeled as V1 through V5. Other embodiments may contain more or fewer metallization layers and a corresponding more or fewer number of vias. Logic region LR includes a full metallization stack, including a portion of each of metallization layers M1-M5 connected by interconnects V2-V5, with V1 connecting the stack to a source/drain contact of logic transistor 902. The memory region MR includes a full metallization stack connecting memory cells MC to transistors 912 in the memory region MR1, and a partial metallization stack connecting a source line SL to transistors 912 in the memory region MR1. Memory cells MC are depicted as being fabricated in between the top of the M3 layer and the bottom the M4 layer. Six ILD layers, identified as ILD0 through ILD5 are depicted in FIG. 14 as spanning the logic region LR and the memory region MR. The ILD layers may provide electrical insulation as well as structural support for the various features of the integrated circuit during many fabrication process steps.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that a dielectric layer with poor coverage is formed prior to the formation of ILD layer, thereby relaxing the high aspect ratio of the memory stacks, which in turn may improve the subsequent formation of the ILD layer and metallization pattern. Another advantage is that voids between adjacent memory stacks are formed to have their top ends lower than that of the top electrodes of the memory stacks, such that the voids would not be exposed during planarizing the ILD layer, which in turn will eliminate or reduce metal residues formed during the formation of the metallization pattern, thereby preventing the undesired contact short. Still another advantage is that the deposition process for forming the dielectric material with low coverage (e.g., PVD or fast CVD) is low-cost and beneficial for high throughput.

In some embodiments, a method for fabricating a semiconductor device is provided. The method includes forming a first memory cell and a second memory cell over a substrate, wherein each of the first and second memory cells comprises a bottom electrode, a resistance switching element over the bottom electrode, and a top electrode over the resistance switching element; depositing a first dielectric layer over the first and second memory cells, such that the first dielectric layer has a void between the first and second memory cells; depositing a second dielectric layer over the first dielectric layer; and forming a first conductive feature and a second conductive feature in the first and second dielectric layers and respectively connected with the top electrode of the first memory cell and the top electrode of the second memory cell.

In some embodiments, a method for fabricating a semiconductor device is provided. The method includes forming a memory cell over a memory region of a substrate, wherein the memory cell comprises a bottom electrode, a resistance switching element over the bottom electrode, and a top electrode over the resistance switching element; depositing a protective layer over the memory region and a logic region of the substrate after forming the memory cell; depositing a first dielectric layer over the protective layer over the memory region and the logic region; etching back the first dielectric layer; and depositing a second dielectric layer over the first dielectric layer over the memory region and the logic region after etching back the first dielectric layer; and forming a first conductive feature in the first and second dielectric layers and connected with the top electrode of the memory cell and a second conductive feature in the second dielectric layer over the logic region.

In some embodiments, a semiconductor device includes a substrate, first and second memory cells, a first dielectric layer, a second dielectric layer, and first and second conductive features. The first and second memory cells are over the substrate. Each of the first and second memory cells comprises a bottom electrode, a resistance switching element over the bottom electrode, and a top electrode over the resistance switching element. The first dielectric layer surrounds the first and second memory cells, in which the first dielectric layer has a void between the first and second memory cells. The second dielectric layer is over the first dielectric layer. The first and second conductive features are in the first and second dielectric layers and respectively connected to the top electrode of the first memory cell and the top electrode of the second memory cell.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate;
   first and second memory cells over the substrate, wherein each of the first and second memory cells comprises a bottom electrode, a resistance switching element over the bottom electrode, and a top electrode over the resistance switching element;
   a first dielectric layer surrounding the first and second memory cells, wherein the first dielectric layer has a void between the first and second memory cells, a bottom of the void has a first edge portion, a second edge portion, and a middle portion between the first and second edge portions, and the middle portion is higher than the first and second edge portions;
   a second dielectric layer over the first dielectric layer; and
   first and second conductive features in the first and second dielectric layers and respectively connected to the top electrode of the first memory cell and the top electrode of the second memory cell.

2. The semiconductor device of claim 1, wherein the void is an air void.

3. The semiconductor device of claim 1, wherein the first dielectric layer has a top surface continuously extending from a sidewall of the first conductive feature to a sidewall of the second conductive feature.

4. The semiconductor device of claim 1, further comprising:
   a protective layer surrounding the first and second memory cells, wherein a sidewall of the top electrode of each of the first and second memory cells is in contact with the protective layer.

5. The semiconductor device of claim 4, wherein a bottom of the first conductive feature and a bottom of the second conductive feature are in contact with the protective layer.

6. The semiconductor device of claim 1, further comprising:
first and second spacers, respectively surrounding the first and second memory cells, wherein a top end of the void is lower than top ends of the first and second spacers.

7. The semiconductor device of claim 1, wherein the void tapers upward in a cross-sectional view.

8. A semiconductor device, comprising:
a substrate;
first and second memory cells over the substrate, wherein each of the first and second memory cells comprises a bottom electrode, a resistance switching element over the bottom electrode, and a top electrode over the resistance switching element; and
a dielectric layer surrounding the first and second memory cells, wherein the dielectric layer has a void between the first and second memory cells, a shortest distance between a top end of the void and the first memory cell is greater than a shortest distance between a bottom end of the void and the first memory cell, and a top surface of the dielectric layer has a recessed region directly above the void of the dielectric layer.

9. The semiconductor device of claim 8, further comprising:
a metal-containing compound layer surrounding the first and second memory cells, wherein the metal-containing compound layer spacing the first and second memory cells from the dielectric layer.

10. The semiconductor device of claim 9, wherein a portion of the metal-containing compound layer is below a bottom surface of the bottom electrode.

11. The semiconductor device of claim 9, wherein the metal-containing compound layer is in contact with the top electrode.

12. The semiconductor device of claim 9, wherein the metal-containing compound layer is a metal oxide layer.

13. The semiconductor device of claim 8, wherein a thickness of the dielectric layer below the void is greater than a thickness of the dielectric layer over the first and second memory cells.

14. A semiconductor device, comprising:
a substrate;
first and second memory cells over the substrate, wherein each of the first and second memory cells comprises a bottom electrode, a resistance switching element over the bottom electrode, and a top electrode over the resistance switching element; and
a dielectric layer surrounding the first and second memory cells, wherein the dielectric layer has first and second inner sidewalls facing each other and between the first and second memory cells, and a top end of the first inner sidewall of the dielectric layer meets a top end of the second inner sidewall of the dielectric layer, and a bottom end of the first inner sidewall of the dielectric layer is spaced apart from a bottom end of the second inner sidewall of the dielectric layer.

15. The semiconductor device of claim 14, wherein the top end of the first inner sidewall of the dielectric layer is higher than a bottom surface of the resistance switching element.

16. The semiconductor device of claim 14, wherein the bottom end of the first inner sidewall of the dielectric layer is lower than a bottom surface of the resistance switching element.

17. The semiconductor device of claim 14, wherein the first inner sidewall is between the second inner sidewall and the first memory cell, and the first inner sidewall of the dielectric layer tapers away from the first memory cell.

18. The semiconductor device of claim 17, wherein the second inner sidewall of the dielectric layer tapers away from the second memory cell.

19. The semiconductor device of claim 17, wherein the dielectric layer has an inner surface connecting the bottom end of the first inner sidewall of the dielectric layer to the bottom end of the second inner sidewall of the dielectric layer, and the inner surface of the dielectric layer is convex upward.

20. The semiconductor device of claim 14, further comprising:
first and second conductive features in the dielectric layer and respectively connected to the top electrode of the first memory cell and the top electrode of the second memory cell, and the dielectric layer is in contact with sidewalls of the first and second conductive features.

* * * * *